United States Patent
Takahashi et al.

(10) Patent No.: US 10,607,819 B2
(45) Date of Patent: Mar. 31, 2020

(54) CLEANING METHOD AND PROCESSING APPARATUS

(71) Applicant: Tokyo Electron Limited, Tokyo (JP)

(72) Inventors: Eiji Takahashi, Miyagi (JP); Norikazu Sasaki, Miyagi (JP); Atsushi Sawachi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 783 days.

(21) Appl. No.: 14/311,640

(22) Filed: Jun. 23, 2014

(65) Prior Publication Data

US 2015/0000707 A1    Jan. 1, 2015

(30) Foreign Application Priority Data

Jun. 28, 2013    (JP) ................................. 2013-136577

(51) Int. Cl.
     *H01J 37/32*      (2006.01)

(52) U.S. Cl.
     CPC .. *H01J 37/32862* (2013.01); *H01J 37/32449* (2013.01); *H01J 37/32853* (2013.01); *Y10T 137/2574* (2015.04)

(58) Field of Classification Search
     CPC ........... H01J 37/32449; H01J 37/32853; H01J 37/32862; Y10T 137/2574
See application file for complete search history.

(56) References Cited

U.S. PATENT DOCUMENTS

| | | | |
|---|---|---|---|
| 5,988,187 A | 11/1999 | Trussell et al. | |
| 8,137,473 B2* | 3/2012 | Moriya | B08B 3/12 134/1 |
| 2005/0016956 A1* | 1/2005 | Liu | C23C 16/4412 216/67 |
| 2006/0097644 A1* | 5/2006 | Kono | G05D 16/206 315/111.21 |

(Continued)

FOREIGN PATENT DOCUMENTS

| | | | |
|---|---|---|---|
| JP | 05121359 A | * | 5/1993 |
| JP | H05-121359 | | 5/1993 |

(Continued)

OTHER PUBLICATIONS

Machine translation of JP2008-010688A dated Jan. 2008.*
Machine translation of JP2008-010688A dated Jan. 2008 (Year: 2008).*

*Primary Examiner* — Douglas Lee
(74) *Attorney, Agent, or Firm* — IPUSA, PLLC

(57) ABSTRACT

A method for cleaning a process chamber of a processing apparatus including the process chamber and a gas supply mechanism. The gas supply mechanism includes a flow splitter, a first flow path communicating with an upstream end of the flow splitter, a first valve provided in the first flow path, a second flow path communicating with a downstream end of the flow splitter and connected to the process chamber, a second valve provided in the second flow path, a bypass flow path connecting the first flow path and the second flow path, and a bypass valve provided in the bypass (Continued)

flow path. The method includes a step of closing the first valve and the second valve and opening the bypass valve, and a step of cleaning the process chamber by introducing a gas through the bypass flow path into the process chamber after opening the bypass valve.

6 Claims, 6 Drawing Sheets

(56) References Cited

U.S. PATENT DOCUMENTS

| | | | | |
|---|---|---|---|---|
| 2007/0163617 A1* | 7/2007 | Ozaki | ................... | B08B 7/0035 |
| | | | | 134/1.1 |
| 2007/0193628 A1* | 8/2007 | Kannan | ................ | G05D 7/0652 |
| | | | | 137/487.5 |
| 2008/0317975 A1* | 12/2008 | Furui | ................ | H01J 37/32862 |
| | | | | 427/575 |

FOREIGN PATENT DOCUMENTS

| | | | | |
|---|---|---|---|---|
| JP | 2008010688 A | * | 1/2008 | |
| JP | 2008010688 A | * | 1/2008 | |
| JP | 2009-283715 | | 12/2009 | |
| JP | 2009283715 A | * | 12/2009 | |
| JP | 2009283715 A | * | 12/2009 | |

* cited by examiner

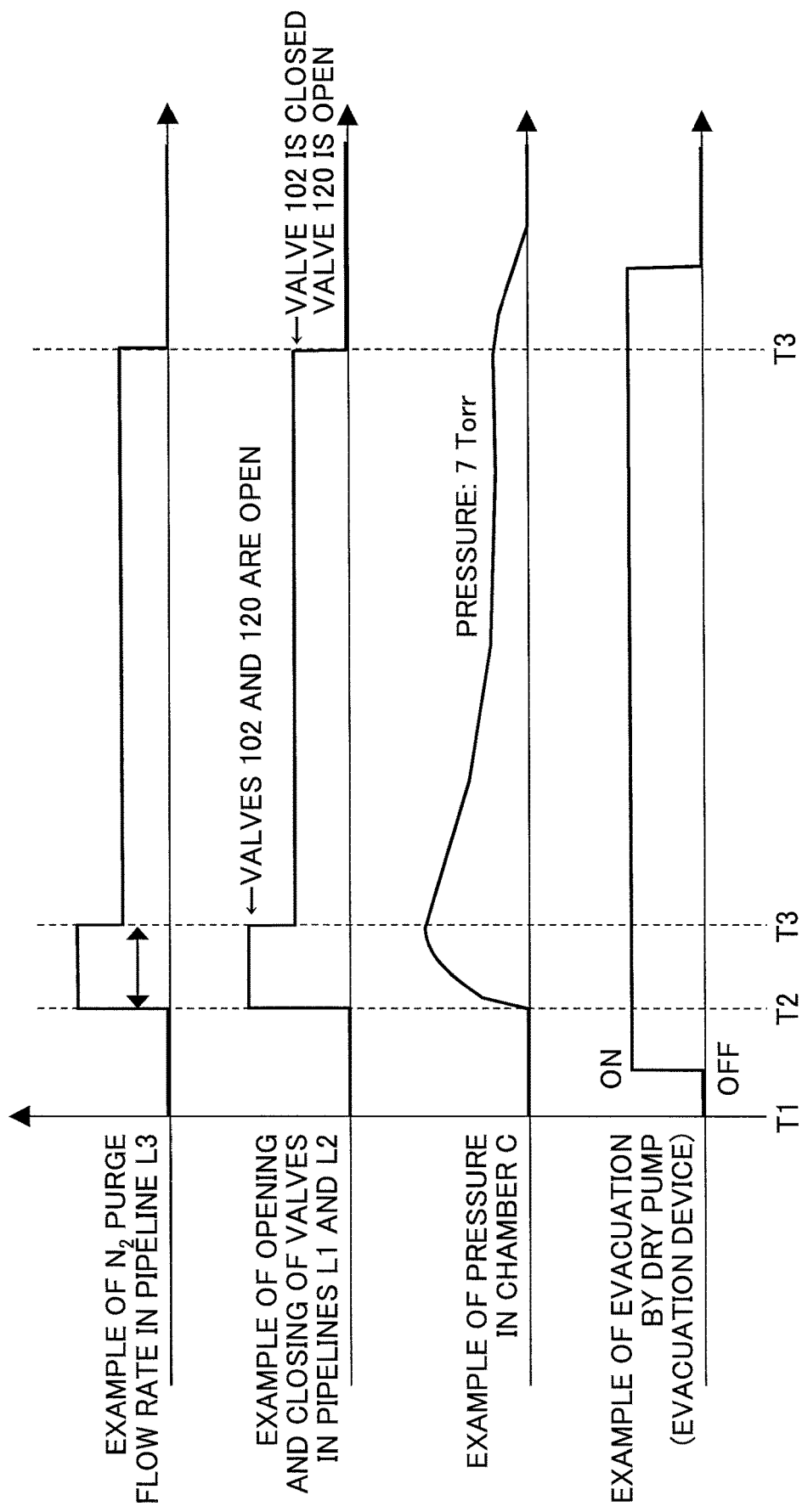

CLEANING METHOD AND PROCESSING APPARATUS

CROSS-REFERENCE TO RELATED APPLICATION

The present application is based upon and claims the benefit of priority of Japanese Patent Application No. 2013-136577, filed on Jun. 28, 2013, the entire contents of which are incorporated herein by reference.

BACKGROUND OF THE INVENTION

1. Field of the Invention

An aspect of this disclosure relates to a cleaning method and a processing apparatus.

2. Description of the Related Art

When performing plasma processing on a wafer, it is important to control radicals in plasma to improve in-plane uniformity of the wafer. A system proposed for this purpose includes a gas diffusion chamber that is formed in an upper electrode and is divided from the center into multiple zones including a center zone and an edge zone. The system can separately control supply of gases into the multiple zones (see, for example, Japanese Laid-Open Patent Publication No. 2009-283715). In this system, gas control can be performed in various manners by, for example, introducing additive gases into desired zones of the multiple zones.

To introduce a gas into multiple zones, a flow splitter (or split-flow controller) for dividing the flow of the gas is necessary. There are two types of flow splitters: a pressure-control flow splitter and a flow-rate control flow splitter. The pressure-control flow splitter makes it possible to control pressures in the respective zones.

Non Plasma Particle Cleaning (NPPC) is a method for removing particles in a chamber. NPPC is a cleaning method in which $N_2$ gas is introduced into a chamber at a high flow rate and the pressure in the chamber is controlled at a predetermined level or higher so that dust is blown off by a shock wave of the gas and ejected from the chamber. When a pressure-control flow splitter is used during NPPC, it is possible to control the pressure in a chamber using a pressure control function of the flow splitter.

However, with a pressure-control flow splitter, when an additive gas is added to a gas after the flow of the gas is divided (i.e., at a downstream position), the pressure in a zone to which the additive gas is added becomes different from the pressure in a zone to which the additive gas is not added. This may influence the accuracy of split flow control. For this reason, when a pressure-control flow splitter is used, it is necessary to limit the flow rate of an additive gas added at a downstream position.

On the other hand, with a flow-rate control flow splitter that directly controls the flow rate of gas, the influence of a pressure change at a downstream position is small and it is possible to supply a greater amount of an additive gas compared with a pressure-control flow splitter.

However, a flow-rate control flow splitter includes a laminar flow tube. A laminar flow tube has a very narrow flow path to measure a flow rate and has a small conductance. For this reason, even when the pressure is controlled at a position upstream of the laminar flow tube to make the pressure in a chamber reach a level that is necessary to perform NPPC, a pressure loss occurs at the laminar flow tube in the flow splitter and the pressure in the chamber located downstream of the laminar flow tube may become lower than the level necessary to perform NPPC. This in turn may reduce the effect of removing particles by NPPC.

SUMMARY OF THE INVENTION

An aspect of this disclosure provides a method of cleaning a process chamber of a processing apparatus including the process chamber and a gas supply mechanism. The gas supply mechanism includes a flow splitter, a first flow path communicating with an upstream end of the flow splitter, a first valve provided in the first flow path, a second flow path communicating with a downstream end of the flow splitter and connected to the process chamber, a second valve provided in the second flow path, a bypass flow path connecting the first flow path and the second flow path, and a bypass valve provided in the bypass flow path. The method includes a bypass opening step of closing the first valve and the second valve and opening the bypass valve, and a cleaning step of cleaning the process chamber by introducing a gas through the bypass flow path into the process chamber after the bypass opening step.

BRIEF DESCRIPTION OF THE DRAWINGS

FIG. 6 is a timing chart of an NPPC process according to an embodiment.

DESCRIPTION OF THE PREFERRED EMBODIMENTS

Embodiments of the present invention are described below with reference to the accompanying drawings. Throughout the specification and the drawings, the same reference numbers are assigned to substantially the same components, and overlapping descriptions of those components are omitted.

<Overall Configuration of Processing Apparatus>

Figure 1:
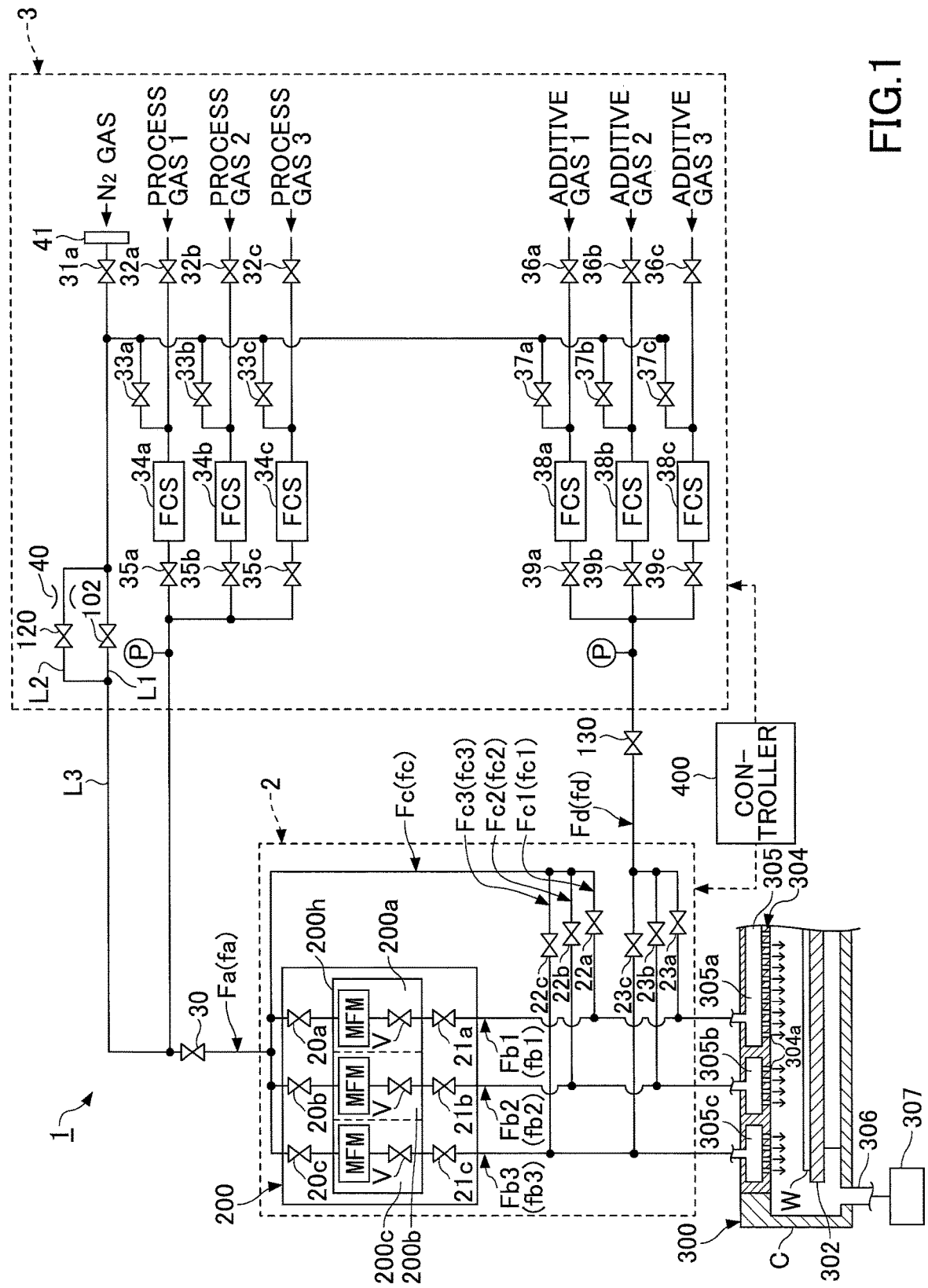
FIG. 1 is a drawing illustrating an exemplary configuration of a processing apparatus including a gas supply mechanism according to an embodiment.

First, an overall configuration of a processing apparatus according to an embodiment of the present invention is described with reference to FIG. 1. FIG. 1 is a drawing illustrating an overall configuration of a processing apparatus including a gas supply mechanism according to an embodiment.

A processing unit 300 includes a chamber C. The chamber C is a process chamber with a substantially cylindrical shape and includes, for example, aluminum whose surface is anodized (or alumite treated). The chamber C is grounded. A table 302, on which a wafer W is to be placed, is provided in the chamber C. The table 302 also functions as a lower electrode.

An upper electrode 304 is disposed above the table 302 to face the table 302. A gas diffusion chamber 305 is formed in the upper electrode 304. The gas diffusion chamber 305 is divided, for example, into three zones from the center of the chamber C: a center zone 305a, a middle zone 305b, and an edge zone 305c. A gas supply mechanism 1 is provided above the chamber C and supplies desired gases to the processing unit 300. Details of the gas supply mechanism 1 are described later. Gases supplied from the gas supply mechanism 1 are introduced in the form of a shower into the chamber C from the three zones of the gas diffusion chamber 305 through gas discharge holes 304a.

An evacuation pipe 306 is connected to the bottom of the chamber C, and an evacuation device 307 is connected to the evacuation pipe 306. The evacuation device 307 evacuates the chamber C using, for example, a dry pump. The chamber C may be used for the same processing (e.g., etching), or for different types of processing (e.g., etching and ashing).

With the above configuration, gases are supplied from the gas supply mechanism 1 into the chamber C. Also, high-frequency power is applied from a high-frequency power supply (not shown) to the upper electrode 304 and/or the table 302. As a result, plasma of the gases is generated between the table 302 and the upper electrode 304. With the generated plasma, plasma processing such as etching, ashing, or film deposition is performed on the wafer W placed on the table 302.

A controller 400 includes a central processing unit (CPU), a read-only memory (ROM), and a random access memory (RAM), which are not shown. The CPU executes plasma processing according to various recipes stored in these storage areas. A recipe includes apparatus control information corresponding to process conditions. For example, the apparatus control information includes process time, temperatures in a process chamber (e.g., an upper electrode temperature, a temperature of a side wall of the process chamber, and an ESC temperature), a pressure (gas exhaust), high-frequency power and voltage, gas flow rates, and heat transfer gas flow rates. Functions of the controller 400 may be implemented either by software or hardware:

<Gas Supply Mechanism>

The gas supply mechanism 1 disposed outside of the chamber C is described. The gas supply mechanism 1 includes a gas control unit 2 and a gas box 3. In the gas supply mechanism 1, a flow of various types of gases supplied from the gas box 3 is divided by a flow splitter 200 in the gas control unit 2 into flows (or streams) of gases, and the flows of gases are supplied through the center zone 305a, the middle zone 305b, and the edge zone 305c of the gas diffusion chamber 305 into the chamber C.

When performing plasma processing on the wafer W, it is important to control radicals in plasma to improve in-plane uniformity of the wafer W. For this purpose, the gas diffusion chamber 305 formed in the upper electrode 304 is divided into multiple zones, and the processing apparatus is configured such that gases supplied into the respective zones can be controlled separately. The number of zones may be any number greater than or equal to two.

The gas box 3 includes a process gas source, an additive gas source, and an $N_2$ gas source that are not shown. In the present embodiment, process gases 1, 2, and 3 are supplied from the process gas source, and additive gases 1, 2, and 3 are supplied from the additive gas source. The gas box 3 may further include other process gas sources and additive gas sources. The additive gas source and piping and valves for connecting the additive gas source may be omitted from the gas box 3.

Inflow on-off valves 32a through 32c, mass flow controllers 34a through 34c, and outflow on-off valves 35a through 35c are provided in piping connecting to the process gas source. With this configuration, the flow rates of the process gases 1 through 3 supplied from the process gas source are adjusted by the mass flow controllers 34a through 34c, and the process gases 1 through 3 are introduced into the upstream end of the gas control unit 2. Piping connecting to the $N_2$ gas source is connected to the piping connecting to the process gas source. On-off valves 33a through 33c are provided in piping connecting to the $N_2$ gas source. By opening and closing the on-off valves 33a through 33c, a predetermined amount of an $N_2$ gas can be caused to flow into the piping connecting to the process gas source.

Similarly, inflow on-off valves 36a through 36c, mass flow controllers 38a through 38c, and outflow on-off valves 39a through 39c are provided in piping connecting to the additive gas source. With this configuration, the flow rates of the additive gases 1 through 3 supplied from the additive gas source are adjusted by the mass flow controllers 38a through 38c, and the additive gases 1 through 3 are introduced into pipes Fb1, Fb2, and Fb3 that are located downstream of the flow splitter 200 or between the processing unit 300 and the flow splitter 200.

The piping connecting to the $N_2$ gas source is connected to the piping connecting to the additive gas source. On-off valves 37a through 37c are provided in piping connecting to the $N_2$ gas source. By opening and closing the on-off valves 37a through 37c, a predetermined amount of the $N_2$ gas can be caused to flow into the piping connecting to the additive gas source. The processing apparatus may also be configured such that an additive gas is introduced only into the edge zone 305c.

In a pipe L3 connecting to the $N_2$ gas source, a transducer 41, an on-off valve 31a, and a first $N_2$ gas supply valve 102 are provided in this order. The transducer 41 measures a pressure in the piping connecting to the $N_2$ gas source, and sends data corresponding to the measured pressure to the controller 400.

Of the piping connecting to the $N_2$ gas source, a pipeline where the first $N_2$ gas supply valve 102 is provided is referred to as a pipeline L1. Of the piping connecting to the $N_2$ gas source, a pipeline that is parallel to the pipeline L1 is referred to as a pipeline L2. In the pipeline L2, a second $N_2$ gas supply valve 120 and an orifice 40 are connected in series. During an NPPC process, the flow rates of the $N_2$ gas flowing through the respective pipelines L1 and L2 are controlled such that the $N_2$ gas is introduced into the chamber C at a high flow rate and the pressure in the chamber C is controlled at a predetermined level or higher. As a result, dust is blown off by a shock wave of the gas generated in the chamber C and ejected from the chamber C. This makes it possible to remove particles in the chamber C including the gas discharge holes 304a, the table 302, and chamber walls. Details of wafer processing and an NPPC process performed by the processing apparatus are described below.

When a first on-off valve 30 at the inflow side of the flow splitter 200 is opened, gases from the process gas source and the $N_2$ gas source are introduced into the flow splitter 200 via piping Fa (first flow path) located upstream of the flow splitter 200, and the flow of the gases is split by the flow splitter 200. When a second on-off valve 130 at the inflow side of the gas control unit 2 is opened, gases from the additive gas source are introduced into the pipes Fb1, Fb2, and Fb3 (second flow paths) located downstream of the flow splitter 200.

Next, an internal configuration of the flow splitter 200 of the present embodiment is described. The flow splitter 200 of the present embodiment is a flow-rate control flow splitter. Instead of the flow-rate control flow splitter 200, a pressure-control flow splitter may be used.

The flow splitter 200 includes a split-flow control unit 200h, first valves 20a, 20b, and 20c (which may be collectively referred to as "first valves 20h), and second valves 21a, 21b, and 21c (which may be collectively referred to as "second valves 21h").

The split-flow control unit 200h includes three split-flow parts 200a, 200b, and 200c, and divides the flow of gases. Each of the split-flow parts 200a, 200b, and 200c includes a mass flow meter MFM for measuring the flow rate of a gas flowing therethrough, and a flow-rate control valve V including a variably-controllable valve element.

The first valves 20h are provided in the piping Fa that is located upstream of and communicates with the split-flow control unit 200h. The second valves 21h are provided, respectively, in the pipes Fb1, Fb2, and Fb3 that are located downstream of the split-flow control unit 200h and communicate with the corresponding split-flow parts 200a, 200b, and 200c of the split-flow control unit 200h.

The piping Fa forms a first flow path fa for introducing gases from the process gas source and the $N_2$ gas source into the flow splitter 200. The pipes Fb1, Fb2, and Fb3 communicate, respectively, with the center zone 305a, the middle zone 305b, and the edge zone 305c of the gas diffusion chamber 305, and form second flow paths fb1, fb2, and fb3 for introducing gases into the corresponding zones (diffusion chambers). The flow splitter 200 configured as described above can divide the flow of gases and introduce the gases into the respective zones.

Flexible gas control can be performed by introducing additive gases at positions downstream of the flow splitter 200 into desired zones of the multiple zones. For this purpose, additive piping Fd connecting to the additive gas source is connected to the pipes Fb1, Fb2, and Fb3 located downstream of the flow splitter 200. Additive gas valves 23a, 23b, and 23c are provided in pipes that branch from the additive piping Fd and are connected to the pipes Fb1, Fb2, and Fb3. It is possible to introduce additive gases into one or more of the multiple zones by opening and closing the additive gas valves 23a, 23b, and 23c.

Also, bypass piping Fc for connecting the piping Fa to the pipes Fb1, Fb2, and Fb3 is provided for the flow splitter 200 of the present embodiment. The bypass piping Fc forms a bypass flow path fc. The bypass piping Fc branches into three bypass pipes Fc1, Fc2, and Fc3 that are connected, respectively, to the pipes Fb1, Fb2, and Fb3. Bypass valves 22a, 22b, and 22c are provided in the bypass pipes Fc1, Fc2, and Fc3, respectively.

An overall configuration of the processing apparatus including the gas supply mechanism 1 of the present embodiment is described above. As described above, the gas supply mechanism 1 of the present embodiment includes the bypass flow path fc (including branched bypass flow paths fc1, fc2, and fc3) that allows a gas to bypass the split-flow control unit 200h. With this configuration, even when a flow-rate control flow splitter is used, it is possible to control the pressure in the chamber C at a predetermined level or higher during an NPPC process and perform the NPPC process effectively. This is described in more detail below.

<NPPC Process and Flow-Rate Control Flow Splitter>

Non Plasma Particle Cleaning (NPPC) is a method for removing particles in a chamber. In NPPC, $N_2$ gas is introduced into the chamber C at a high flow rate and the pressure in the chamber C is controlled at a predetermined level or higher so that dust is blown off by a shock wave of the gas generated in the chamber C and ejected from the chamber C. When a pressure-control flow splitter is used during NPPC, it is possible to control the pressure in the chamber using a pressure control function of the flow splitter. When the pressure in the chamber is controlled, for example, at 5 Torr or higher (e.g., 7 Torr), it is possible to generate a gas shock wave with a desired strength and effectively perform an NPPC process.

However, with a pressure-control flow splitter, when an additive gas is added at a position downstream of the flow splitter, the pressure in a zone to which the additive gas is added becomes different from the pressure in a zone to which the additive gas is not added. This may influence the accuracy of split flow control. For this reason, when a pressure-control flow splitter is used, it is necessary to limit the flow rate of an additive gas added at a downstream position.

On the other hand, with the flow-rate control flow splitter 200 of the present embodiment that directly controls the flow rate of gas, the influence of a pressure change at a position downstream of the flow splitter 200 is small and it is possible to supply a greater amount of an additive gas compared with a pressure-control flow splitter.

Figure 2:
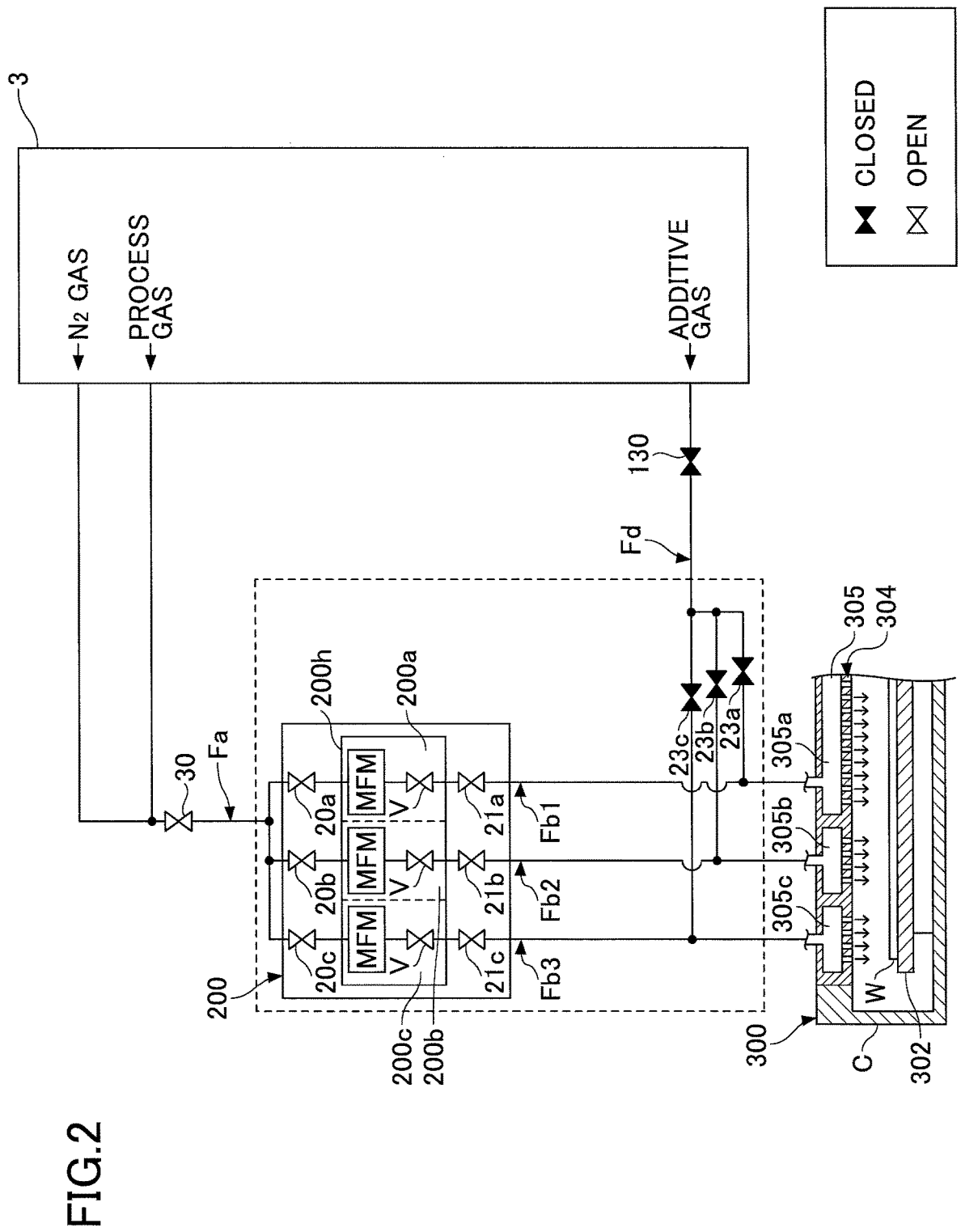
FIG. 2 is a drawing illustrating a comparative example of a processing apparatus including a gas supply mechanism.

However, the flow-rate control flow splitter 200 includes the mass flow meters MFM (laminar flow tubes). When the flow-rate control flow splitter 200 has a configuration as illustrated by FIG. 2, a gas is introduced, during NPPC, through the split-flow control unit 200h into the chamber C. As described above, the mass flow meters MFM of the split-flow control unit 200h have a very small conductance. Therefore, even when the flow rate of the $N_2$ gas is adjusted using devices such as the first and second $N_2$ gas supply valves 102 and 120 (see FIG. 1) in the gas box 3 to make the pressure in the chamber C reach a level that is necessary to perform NPPC, a pressure loss occurs when the gas passes through the mass flow meters MFM with a small conductance. As a result, the pressure in the flow paths Fb1, Fb2, and Fb3 and the chamber C located downstream of the mass flow meters MFM may become lower than the level necessary to perform NPPC. This in turn may reduce the strength of a gas shock wave generated in the chamber C and make it difficult to effectively remove particles by NPPC.

On the other hand, as illustrated by FIG. 1, according to the configuration of the flow-rate control flow splitter 200 of the present embodiment, the bypass flow path fc is formed in addition to paths that go through the split-flow control unit 200h, and the bypass valves 22a, 22b, and 22c are provided in the bypass piping Fc implementing the bypass flow path fc. With this configuration, it is possible to cause the $N_2$ gas to bypass the mass flow meters MFM and flow through the bypass flow path fc into the chamber C during NPPC, by opening and closing the first valves 20a through 20c, the second valves 21a through 21c, and the bypass valves 22a through 22c. The bypass flow path fc has a conductance that is greater than the conductance of the mass flow meters MFM. Therefore, almost no pressure loss occurs at the bypass flow path fc. Accordingly, with the flow-rate control flow splitter 200 of the present embodiment, it is possible to control the pressure in the chamber C at a predetermined level or higher by controlling the flow rate of the $N_2$ gas flowing through the pipelines L1 and L2. Thus, the configuration of the present embodiment makes it possible to generate a gas shock wave with a sufficient strength in a chamber and thereby makes it possible to effectively remove particles by NPPC.

<Wafer Processing and NPPC Process>

Figure 3:
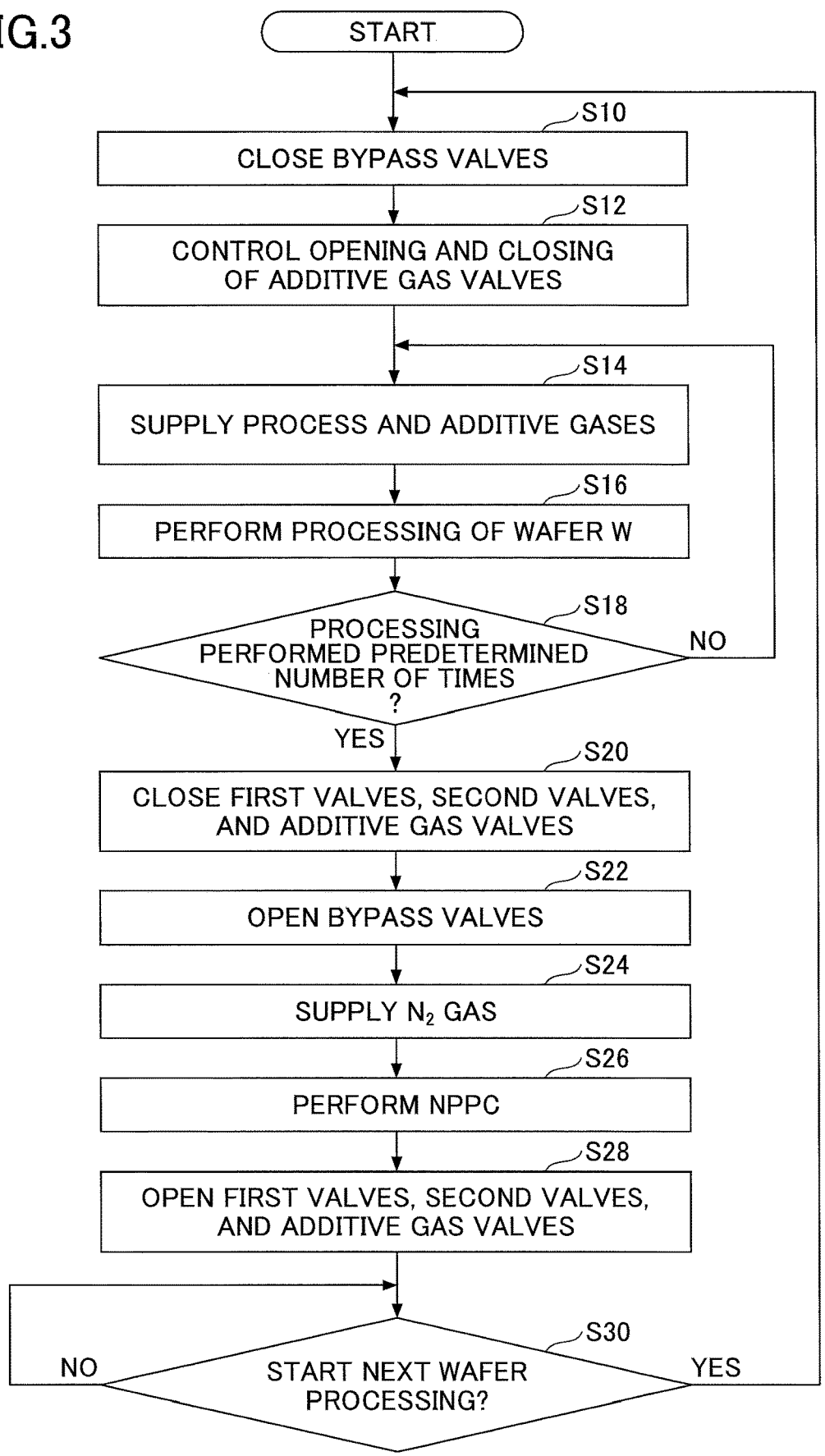
FIG. 3 is a flowchart illustrating wafer processing and an NPPC process performed by a processing apparatus of an embodiment.
Figure 4:
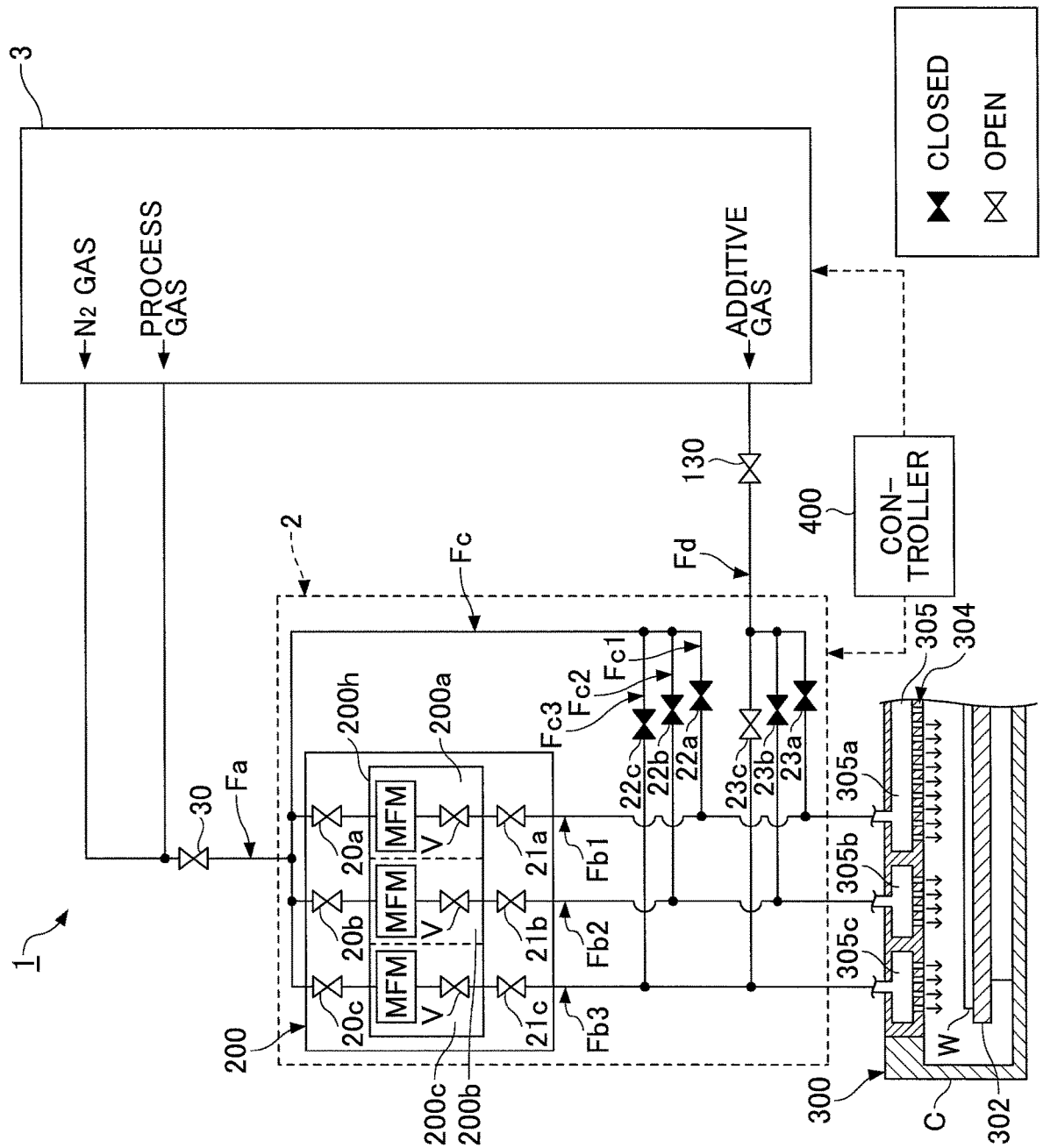
FIG. 4 is a drawing illustrating opening and closing of valves of a gas supply mechanism during wafer processing according to an embodiment.
Figure 5:
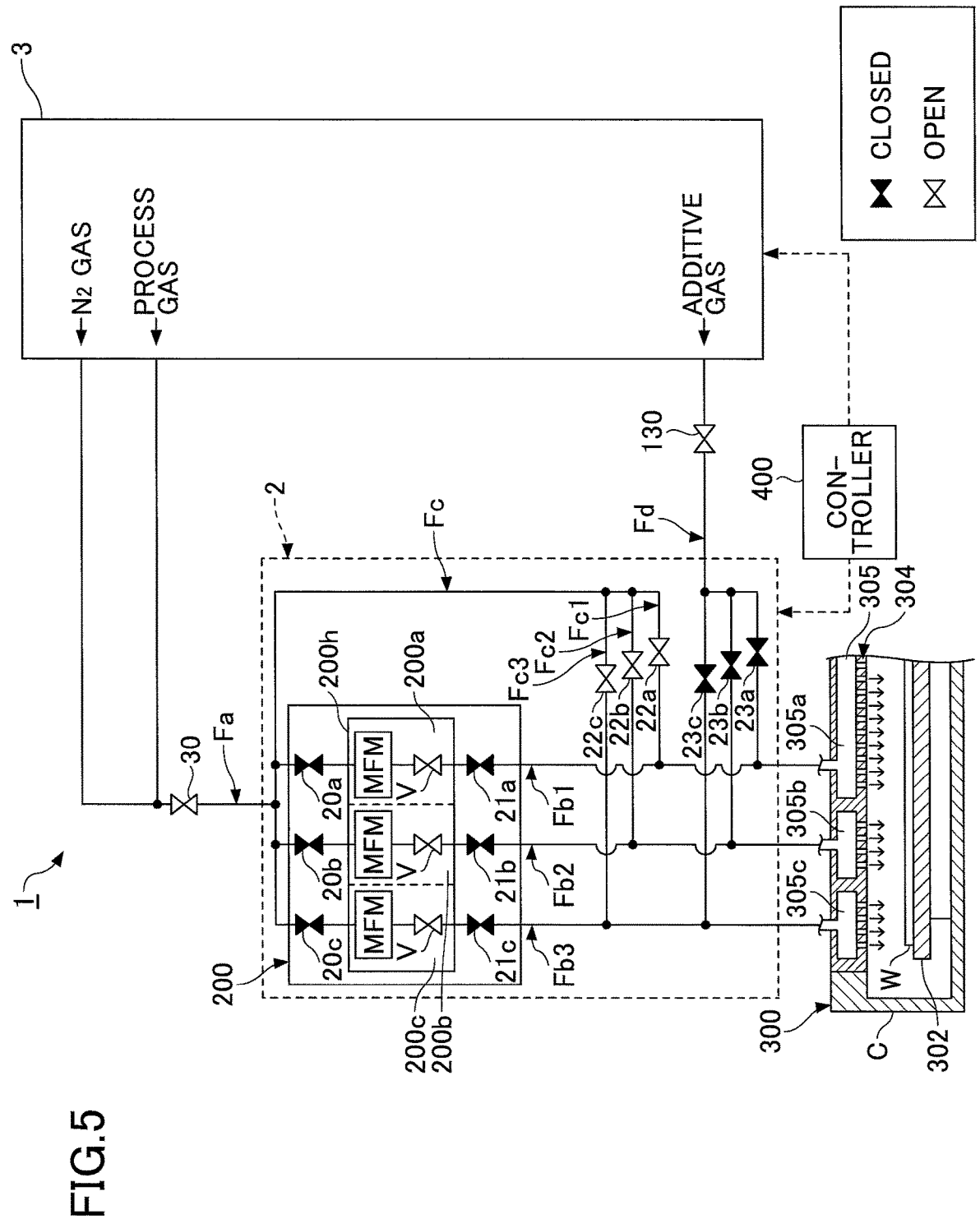
FIG. 5 is a drawing illustrating opening and closing of valves of a gas supply mechanism during NPPC according to an embodiment.

Next, wafer processing and an NPPC process according to an embodiment of the present invention are described with reference to FIGS. 3 through 6. FIG. 3 is a flowchart illustrating wafer processing and an NPPC process performed by the processing apparatus of the present embodiment. FIG. 4 is a drawing illustrating opening and closing of valves of the gas supply mechanism 1 during wafer processing according to an embodiment. FIG. 5 is a drawing illustrating opening and closing of valves of the gas supply mechanism 1 during NPPC according to an embodiment. FIG. 6 is a timing chart of an NPPC process according to an embodiment. The wafer processing and the NPPC process of FIG. 3 are controlled by the controller 400.

As illustrated by FIG. 3, to start the wafer processing, the controller 400 closes the bypass valves 22a through 22c at step S10 (bypass closing step). As a result, as illustrated in FIG. 4, all of the bypass valves 22a through 22c are closed. Next, at step S12, the controller 400 controls opening and closing of valve elements of the additive gas valves 23a through 23c. For example, when introducing an additive gas only into the edge zone 305c of the multiple zones, the controller 400 opens the additive gas valve 23c and closes the valve elements of the additive gas valves 23a and 23b. As a result, as illustrated in FIG. 4, the additive gas valve 23c is opened and the valve elements of the additive gas valves 23a and 23b are closed.

Next, at step S14, the controller 400 causes the gas box 3 to supply process gases and an additive gas. The process gases 1 through 3 flow through the first flow path fa located upstream of the flow splitter 200, and the flow of gases is divided into flows of gases with desired flow rates by the split-flow parts 200a, 200b, and 200c of the split-flow control unit 200h. The flows of gases pass through the second flow paths fb1, fb2, and fb3, and are introduced into the chamber C via the corresponding zones of the gas diffusion chamber 305.

Next, at step S16, the controller 400 ionizes the gases introduced into the chamber C to generate plasma and performs plasma processing on the wafer W (processing step). Here, the additive gas is added to the process gases introduced into the edge zone. Thus, the processing apparatus of the present embodiment can perform gas control in various manners and thereby control particularly radicals in plasma to improve in-plane uniformity of a wafer. Still, however, the additive piping Fd and the additive gas valves 23a, 23b, and 23c may be omitted. In this case, the controller 400 skips step S12 and proceeds to step S14.

Next, at step S18, the controller 400 determines whether the plasma processing of the wafer W has been performed a predetermined number of times, and repeats steps S14 and S16 until the plasma processing is performed the predetermined number of times. When it is determined that the plasma processing of the wafer W has been performed the predetermined number of times, the controller 400 proceeds to step S20 and closes all of the first valves 20a through 20c, the second valves 21a through 21c, and the additive gas valves 23a through 23c. As a result, as illustrated in FIG. 5, valve elements of all of the first valves 20a through 20c, the second valves 21a through 21c, and the additive gas valves 23a through 23c are closed. Next, at step S22, the controller 400 opens all of the bypass valves 22a through 22c (bypass opening step). As a result, as illustrated in FIG. 5, all of the bypass valves 22a through 22c are opened.

Next, at step S24, the controller 400 causes the gas box 3 to supply the $N_2$ gas. As illustrated in FIG. 6, at time T1, the first and second $N_2$ gas supply valves 102 and 120 of FIG. 1 are closed. At time T2, the first and second $N_2$ gas supply valves 102 and 120 are opened, and the $N_2$ gas is supplied via the first and second $N_2$ gas pipelines L1 and L2. As a result, the pressure in the chamber C increases rapidly.

At time T3, the first $N_2$ gas supply valve 102 is closed, and only the second $N_2$ gas supply valve 120 is kept open. With the shock wave of the gas generated by the operation of valves described above, NPPC is performed at step S26 (cleaning step).

During NPPC, as indicated by "EXAMPLE OF $N_2$ PURGE FLOW RATE IN PIPELINE L3" of FIG. 6, the $N_2$ gas flows through the pipelines L1 and L2 at a high flow rate. As illustrated by FIG. 5, the $N_2$ gas flowing at a high flow rate is introduced through the bypass flow path fc into the chamber C. For example, the flow rate of the $N_2$ gas flowing through the bypass flow path fc is 8 SLM or higher, and preferably between 8 SLM and 20 SLM.

In the bypass flow path fc, almost no pressure loss occurs. As illustrated in FIG. 6, the pressure in the chamber C is adjusted to 5 Torr or higher (e.g., 7 Torr), and preferably between 5 Torr and the atmospheric pressure. As a result, during NPPC, particles adhering to the gas discharge holes 304a, the table 302, and chamber walls (see FIG. 1) are blown off by the shock wave of the gas and are caused to fly as dust in a space in the chamber C. The flying dust is ejected from the chamber C by an evacuation device such as a dry pump as indicated in FIG. 6. Thus, the processing apparatus of the present embodiment can effectively remove particles from the chamber C and clean the inside of the chamber C.

After NPPC, at step S28, the controller 400 opens valve elements of all of the first valves 20a through 20c, the second valves 21a through 21c, and the additive gas valves 23a through 23c. Then, at step S30, the controller 400 determines whether to start (next) wafer processing. Until wafer processing is started, the processing apparatus is in an idle state (vacuum state). During the idle state, all valves are opened as illustrated by FIG. 1 and a small amount of the $N_2$ gas is supplied to clean the inside of the piping. When it is determined to start wafer processing at step S30, the controller 400 returns to step S10 to close the bypass valves 22a through 22c, and repeats steps S12 through S30.

The controller 400 may be configured to start wafer processing when, for example, the number of particles measured by a particle monitor is less than or equal to a predetermined value, and to not start wafer processing and perform cleaning such as NPPC when the measured number of particles is greater than the predetermined value. Also, the controller 400 may be configured to determine whether to start wafer processing based on detection results of other types of sensors.

As described above, the gas supply mechanism 1 of the present embodiment is configured to cause the $N_2$ gas to bypass the flow splitter 200 and flow through the bypass flow path fc into the chamber C during NPPC, by opening and closing the first valves 20a through 20c, the second valves 21a through 21c, and the bypass valves 22a through 22c. In the bypass flow path fc, almost no pressure loss occurs. Accordingly, with the configuration of the gas control unit 2 including the flow-rate control flow splitter 200 of the present embodiment, it is possible to control the pressure in the chamber C at a predetermined level or higher by controlling the flow rate of the $N_2$ gas flowing through the pipelines L1 and L2. This in turn makes it possible to effectively remove particles with a shock wave of a gas during NPPC.

Cleaning by NPPC may be performed after one or several lots of wafers are processed. Also, cleaning by NPPC may be performed regularly, or irregularly based on the number of wafers processed. Also, cleaning by NPPC may be performed each time one wafer is processed, or after maintenance of the inside of the chamber C is performed.

In the above embodiment, NPPC is performed with all of the bypass valves 22a through 22c opened. However, NPPC may be performed with at least one of the bypass valves 22a through 22c opened. Nevertheless, it is preferable to open all of the bypass valves 22a through 22c to most effectively perform cleaning.

As described above, an aspect of this disclosure provides a cleaning method for effectively cleaning a process chamber using a gas supply mechanism that can perform split flow control, and a processing apparatus that can perform the cleaning method.

A cleaning method and a processing apparatus according to an embodiment are described above. However, the present invention is not limited to the specifically disclosed embodiment, and variations and modifications may be made without departing from the scope of the present invention.

For example, a cleaning method of the present invention may also be performed by using a pressure-control flow splitter instead of a flow-rate control flow splitter.

Also, the present invention may be applied not only to an etching apparatus, but also to an ashing apparatus and a film deposition apparatus. Examples of plasma generating units usable for a processing apparatus may include a capacitively coupled plasma (CCP) generating unit; an inductively coupled plasma (ICP) generating unit; a helicon wave plasma (HWP) generating unit; a microwave excitation surface wave plasma generating unit for generating microwave excitation surface wave plasma including microwave plasma generated by a radial line slot antenna and slot plane antenna (SPA) plasma; electron cyclotron resonance (ECR) plasma generating unit; and a remote plasma generating unit using one of the above generating units. The present invention may also be applied to a processing apparatus such as a heat treatment apparatus or a substrate transfer apparatus that processes a wafer without using plasma.

Further, an object to be processed according to the present invention is not limited to a (semiconductor) wafer used for descriptions in the above embodiment. For example, an object to be processed may be a large-size substrate for a flat panel display, an EL element, or a substrate for a solar battery.

What is claimed is:
1. A method for cleaning a process chamber of a processing apparatus including the process chamber and a gas supply mechanism that includes
  a gas control unit including
    a flow splitter,
    a first flow path communicating with an upstream end of the flow splitter,
    a first valve provided in the first flow path,
    multiple second flow paths communicating with a downstream end of the flow splitter and connected to the process chamber,
    multiple second valves provided in the respective second flow paths,
    a bypass flow path connecting the first flow path and the second flow paths to bypass the flow splitter, and
    a bypass valve provided in the bypass flow path, and
  a gas supply unit including
    a gas source that supplies a gas to the gas control unit,
    a third flow path connecting the gas source and the first flow path to each other,
    a third valve and an orifice that are connected in series and provided in the third flow path,
    a fourth flow path disposed parallel to the third flow path and connecting the gas source and the first flow path to each other, and
    a fourth valve provided in the fourth flow path, no orifice being provided in the fourth flow path,
  the method comprising:
    a bypass opening step of closing the first valve and the second valves and opening the bypass valve; and
    a cleaning step of cleaning the process chamber by
      opening both of the third valve and the fourth valve after the bypass opening step, and thereby introducing the gas from the gas source through the bypass flow path into the process chamber and increasing a pressure in the process chamber to a predetermined value, and
      closing the fourth valve provided in the fourth flow path including no orifice after the pressure in the process chamber increases to the predetermined value.

2. The method as claimed in claim 1, wherein the flow splitter is a flow-rate control flow splitter.

3. The method as claimed in claim 1, further comprising:
  a bypass closing step of closing the bypass valve and opening the first valve and the second valves; and
  a processing step of dividing, by the flow splitter, a flow of a process gas supplied through the first flow path after the bypass closing step, supplying the process gas through the second flow paths into the process chamber, and performing processing with the process gas in the process chamber,
  wherein the cleaning step is performed subsequent to the bypass opening step after the processing step is repeated a predetermined number of times subsequent to the bypass closing step.

4. The method as claimed in claim 1, wherein
  one end of the bypass flow path is connected to the first flow path at a position upstream of the first valve;
  another end of the bypass flow path branches into multiple bypass flow paths that are connected to the corresponding second flow paths at positions downstream of the second valves;
  multiple bypass valves are provided in the respective bypass flow paths;
  in the bypass opening step, the first valve and the second valves are closed, and one or more of the bypass valves are opened; and
  in the cleaning step after the bypass opening step, the process chamber is cleaned by introducing the gas into the process chamber through one or more of the bypass flow paths whose bypass valves are opened.

5. A processing apparatus, comprising:
  a process chamber;
  a gas supply mechanism that includes
    a gas control unit including
      a flow splitter,
      a first flow path communicating with an upstream end of the flow splitter,
      a first valve provided in the first flow path,
      multiple second flow paths communicating with a downstream end of the flow splitter and connected to the process chamber,
      multiple second valves provided in the respective second flow paths,
      a bypass flow path connecting the first flow path and the second flow paths to bypass the flow splitter, and
      a bypass valve provided in the bypass flow path, and a gas supply unit including
a gas source that supplies a gas to the gas control unit,
a third flow path connecting the gas source and the first flow path to each other,
a third valve and an orifice that are connected in series and provided in the third flow path,
a fourth flow path disposed parallel to the third flow path and connecting the gas source and the first flow path to each other, and
a fourth valve provided in the fourth flow path, no orifice being provided in the fourth flow path; and
a controller configured to execute a process including
closing the first valve and the second valves and opening the bypass valve, and
cleaning the process chamber by
opening both of the third valve and the fourth valve after the opening of the bypass valve, and thereby introducing the gas from the gas source through the bypass flow path into the process chamber and increasing a pressure in the process chamber to a predetermined value, and closing the fourth valve provided in the fourth flow path including no orifice after the pressure in the process chamber increases to the predetermined value.

6. The processing apparatus as claimed in claim 5, wherein
one end of the bypass flow path is connected to the first flow path at a position upstream of the first valve;
another end of the bypass flow path branches into multiple bypass flow paths that are connected to the corresponding second flow paths at positions downstream of the second valves;
multiple bypass valves are provided in the respective bypass flow paths; and
in the process, after closing the first valve and the second valves and opening one or more of the bypass valves, the controller further configured to clean the process chamber by introducing the gas into the process chamber through one or more of the bypass flow paths whose bypass valves are opened.

* * * * *